US010296675B2

(12) United States Patent
Li et al.

(10) Patent No.: US 10,296,675 B2
(45) Date of Patent: May 21, 2019

(54) SYSTEM AND METHOD FOR DETERMINING DYNAMIC MOTION DATA IN ROBOT TRAJECTORY

(71) Applicant: ABB SCHWEIZ AG, Baden (CH)

(72) Inventors: Xiongzi Li, West Hartford, CT (US); Steinar Riveland, Klepp Stasjon (NO); Oeyvind A. Landsnes, Mandal (NO); Christoffer Apneseth, Stavanger (NO); Masao Hara, Fujieda (JP); Jianjun Wang, West Hartford, CT (US)

(73) Assignee: ABB Schweiz AG, Baden (CH)

( * ) Notice: Subject to any disclaimer, the term of this patent is extended or adjusted under 35 U.S.C. 154(b) by 501 days.

(21) Appl. No.: 14/983,645

(22) Filed: Dec. 30, 2015

(65) Prior Publication Data
US 2017/0193137 A1 Jul. 6, 2017

(51) Int. Cl.
G06F 7/60 (2006.01)
G06F 17/50 (2006.01)
G06F 17/16 (2006.01)
B25J 9/16 (2006.01)

(52) U.S. Cl.
CPC ........ G06F 17/5009 (2013.01); B25J 9/1664 (2013.01); G06F 17/16 (2013.01)

(58) Field of Classification Search
CPC .................................................. G06F 17/5009
USPC ............................................................ 703/2
See application file for complete search history.

(56) References Cited

U.S. PATENT DOCUMENTS

| 4,974,210 | A | * | 11/1990 | Lee | ........................ | B25J 9/1682 |
| | | | | | | 700/260 |
| 6,256,597 | B1 | | 7/2001 | Wang | | |
| 6,266,071 | B1 | | 7/2001 | Stam | | |
| 6,292,715 | B1 | | 9/2001 | Rongo | | |
| 9,238,304 | B1 | | 1/2016 | Bradski et al. | | |
| 2004/0164041 | A1 | | 8/2004 | Sawodny et al. | | |

(Continued)

FOREIGN PATENT DOCUMENTS

| CN | 201482642 | 5/2010 |
| CN | 101739488 | 6/2010 |

(Continued)

OTHER PUBLICATIONS

International Search Report and Written Opinion, PCT Appln. No. PCT/US2016/69541, dated May 18, 2017, 11 pgs.

(Continued)

Primary Examiner — Timothy A Mudrick
(74) Attorney, Agent, or Firm — Taft Stettinius & Hollister; J. Bruce Schelkopf

(57) ABSTRACT

A simulation system to determine an optimal trajectory path for a robot with an attached implement includes a trajectory simulator which provides a simulated trajectory path for an implement, an implement model database which comprises motion data of the implement, and a logger that associates a time stamp of the implement's motion during the simulated trajectory path to generate logger data. A profile is determined by the logger data received from the logger which identifies implement motion that exceeds predetermined thresholds, and a tuner adjusts the simulated trajectory path so as to reduce the number of times predetermined thresholds are exceeded.

21 Claims, 10 Drawing Sheets

(56) References Cited

U.S. PATENT DOCUMENTS

| | | |
|---|---|---|
| 2004/0213915 A1* | 10/2004 | Andersen ......... G05B 19/40931 |
| | | 427/421.1 |
| 2006/0048846 A1 | 3/2006 | Roenneburg |
| 2008/0022929 A1 | 1/2008 | Lind |
| 2011/0106306 A1 | 5/2011 | Kim et al. |
| 2012/0156362 A1 | 6/2012 | Sadovoy |
| 2014/0371905 A1 | 12/2014 | Eberst et al. |
| 2016/0016311 A1 | 1/2016 | Konolige et al. |

FOREIGN PATENT DOCUMENTS

| | | |
|---|---|---|
| EP | 1435280 | 7/2004 |
| EP | 2468463 | 6/2012 |
| WO | 2006046536 | 5/2006 |

OTHER PUBLICATIONS

Stam, "Real Time Dynamics for Games", Proceedings of the Game Developer Conference, also available at http://www.dgp.toronto.edu/people/stam/reality/index.html, Mar. 1, 2003, 18 pgs.

Connor et al. "Paint Deposition Modeling for Trajectory Planning on Automotive Surfaces", IEEE Transactions on Automation Science and Engineering, vol. 2, No. 4, Oct. 2005; pp. 381-392.

Li et al. "Computational Study of Particle in Flight Behavior in the HVOF Thermal Spray Process", Chemical Engineering Science 61; Jun. 13, 2006, pp. 6540-6552.

\* cited by examiner

US 10,296,675 B2

SYSTEM AND METHOD FOR DETERMINING DYNAMIC MOTION DATA IN ROBOT TRAJECTORY

TECHNICAL FIELD

The present invention is generally directed to systems and related methods for adjusting robot trajectory based on robot dynamic motion data. Specifically, the present invention is directed toward systems and methods for simulating robot movements to determine peak movement or force values that cause damage to an implement carried by the robot or to the robot.

BACKGROUND ART

It is well known in various industries to use robots in the assembly of large quantities of manufactured goods. Robots are used in the automated assembly of automobiles, circuit boards, computers, the manufacture of food, and many other items. Robots provide advantages over manual labor and cost savings in view of their ability to perform boring and repetitive tasks very well with minimal error.

One such task is the painting of automobile exterior body parts. Similar material dispensing robots are also used in general industries for the manufacture of airplane components, windmills, buses, trains and the like. Although robots provide a clear time savings advantage in operation, setting up a robot to perform a specific task is a cumbersome process. For example, in paint application processes, care must be taken so that desired paint coverage is obtained with minimal waste.

It will be appreciated that it is desirable to program a predetermined path, sometimes referred to as a trajectory, of a robot arm which carries an implement that performs the task as quickly and efficiently as possible. However it has been found that quick changes in implement motion result in damage to the implement. For example, it is believed that a gyroscopic effect caused by the robot reorientation (wrist motion) is one of the main reasons for a painting device's atomizer turbine to cause "touch down," wherein a rotor of the dispenser comes in contact with a stator. The turbine's bearing air "cushion" is designed to maintain spacing between the stator and rotor during operational speeds of 10,000 to 70,000 RPM. However, sudden changes in the robot's wrist motion overcomes the air cushion and results in damage to the atomizer turbine. Such damage to the turbine, which is an expensive part, results in machine downtime and less-than-ideal distribution of paint. Therefore, there is a need in the art to simulate motion of an implement carried by a robotic arm to determine where in the robot arm's trajectory path damaging dynamics take place and to adjust the path so as not to adversely affect the implement and its associated function.

SUMMARY OF THE INVENTION

In light of the foregoing, it is a first aspect of the present invention to provide systems and related methods for determining dynamic motion data and robot trajectory.

It is another aspect of the present invention to provide a simulation system to determine an optimal trajectory path for a robot with an attached implement, comprising a trajectory simulator providing a simulated trajectory path for an implement, an implement model database comprising motion data of the implement, a logger that associates a time stamp of the implement's motion during the simulated trajectory path to generate logger data, a profile determined by the logger data received from the logger which identifies implement motion that exceeds predetermined thresholds, and a tuner to adjust the simulated trajectory path so as to reduce the number of times predetermined thresholds are exceeded.

It is yet another aspect of the present invention to provide a simulation system to determine an optimal trajectory path for a robot with an attached implement, comprising a trajectory module that defines simulated motion of a simulated robot and a simulated implement, a data module that generates motion data of the simulated robot and the simulated implement module, and a tuning module that adjusts the simulated motion based on the motion data that exceeds predetermined thresholds.

Still another aspect of the present invention is to provide a method for optimizing robot implement performance comprising generating a model of implement motion for an implement, plotting a trajectory for the implement, running a simulation of the trajectory to determine implement motion that exceeds predetermined thresholds, and tuning the trajectory to reduce the number of times implement motion exceeds predetermined thresholds.

BRIEF DESCRIPTION OF DRAWINGS

These and other features and advantages of the present invention will be become better understood with regard to the following description, appended claims, and accompanying drawings wherein:

BEST MODE FOR CARRYING OUT THE INVENTION

Figure 1:
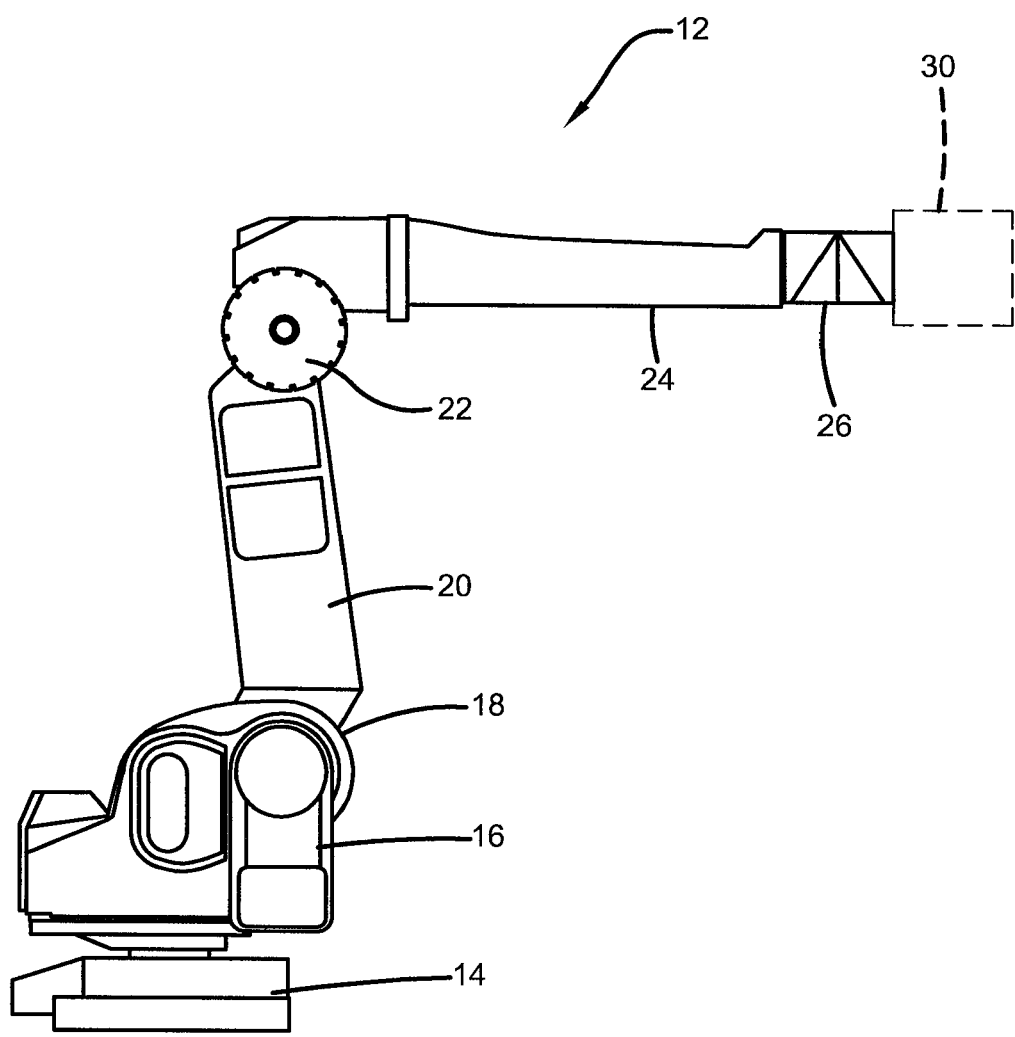
FIG. 1 is an elevational view of a robot according to the concepts of the present invention.

Referring now to the drawings and in particular to FIGS. 1-4 and 9, it can be seen that a system and related method for determining dynamic motion data in robot trajectory are shown. As best seen in FIG. 1, a robot is designated generally by the numeral 12 and, as is common with most robots, has six degrees of freedom. However, any robot that performs a repeatable motion on a predetermined path or trajectory may utilize the teachings of the present invention. The robot 12 is provided with a platform 14, which is typically affixed to a stationary surface. The platform 14 may support a base 16 which may rotate with respect to the platform. The base 16 provides a joint 18 from which may extend a moveable arm 20, which has a prescribed range of motion. At an end opposite the joint 18, the arm 20 provides an elbow joint 22 which is connected to a forearm 24. As such, the forearm 24 may be moveable with respect to the arm 20 in a desired range of motion. Extending from the forearm 24, at an end opposite the joint 22, may be a wrist 26 upon which may be mounted an implement 30. The wrist 26 and the attached implement 30 are rotatable with respect to the forearm and may also be referred to as a tool. Such implements or tools may include, but are not limited to an air motor, a gripper, a fluid dispenser, a welder, a welding torch or the like. In other words, the implement may be anything that is carried by the wrist and which performs a specified function in conjunction with operation of the robot 12. For example, the implement may be any rotating, reciprocating, linearly moving tool or the like used with the robot.

Figure 1A:
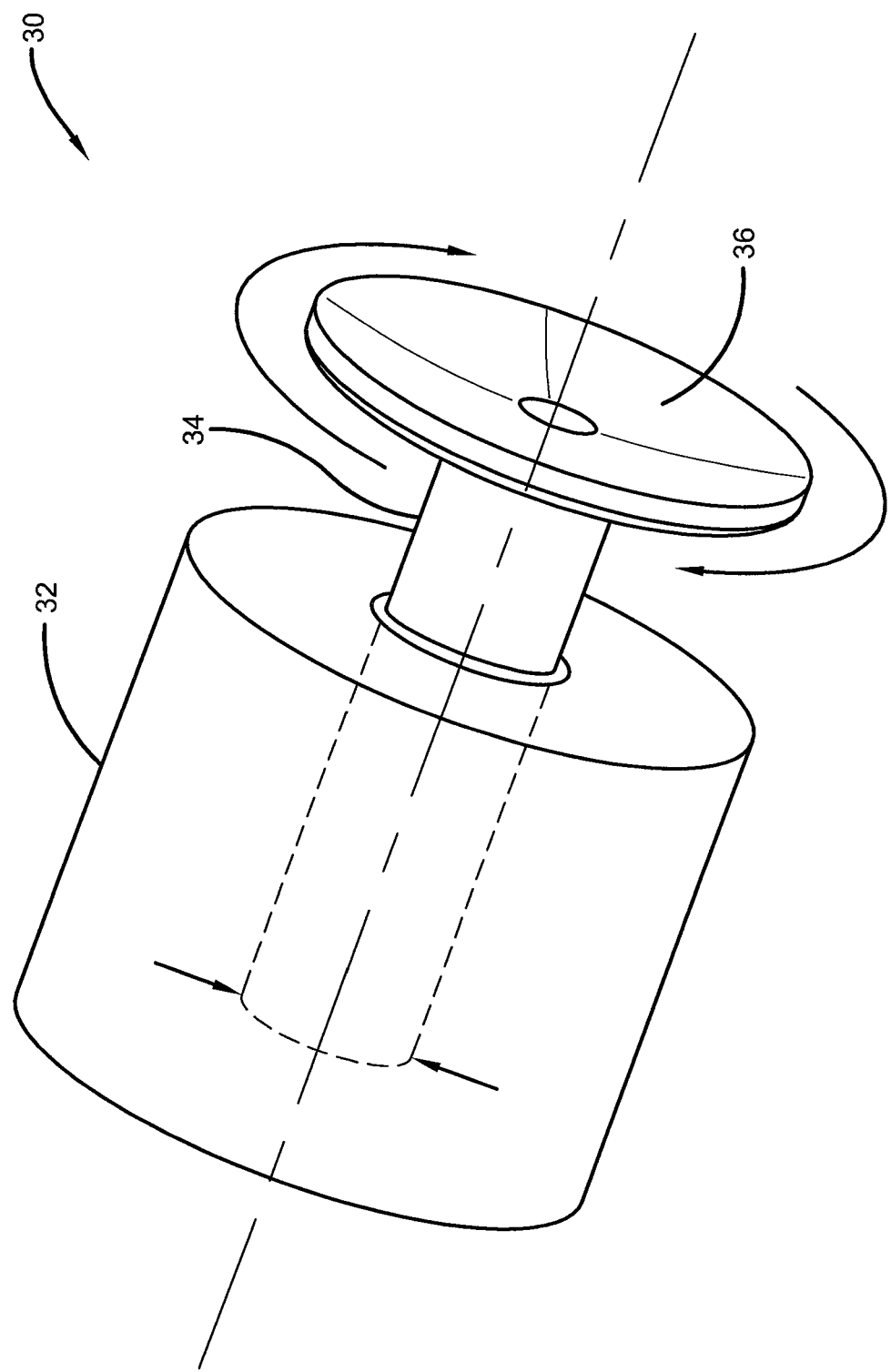
FIG. 1A is a detailed perspective view of an exemplary implement that may be used with the robot according to the concepts of the present invention.

As seen in FIG. 1A, the implement 30 may, in some embodiments, be a housing 32 which supports a rotating spindle 34 using some type of bearing mechanism. The bearing may be in the form of ball bearings, air bearings or the like. The rotating spindle 34 may support a rotating disc 36. For example, the disc 36 may be in the form of a bell cup, a bell disc, a grinding tool, a saw blade or anything similar.

Figure 2:
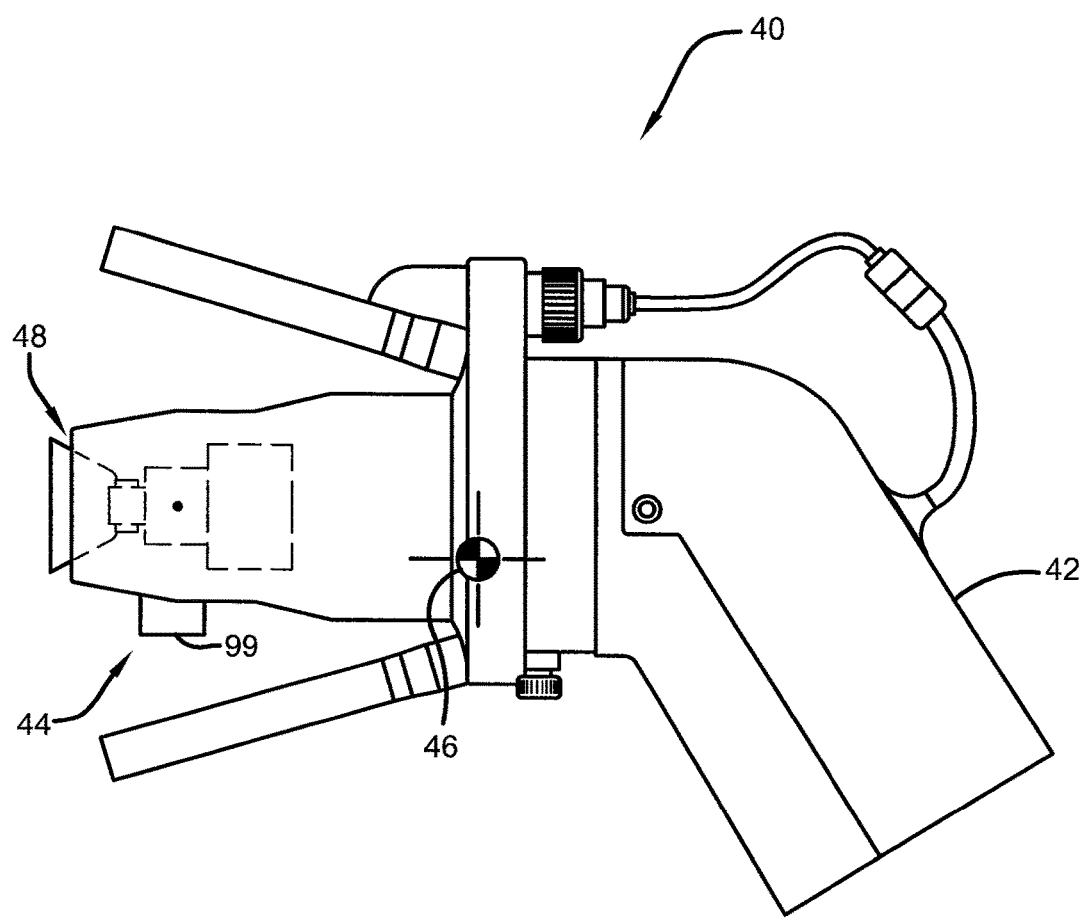
FIG. 2 is an elevational view of a paint dispensing implement for use with the robot according to the concepts of the present invention.

One such implement is shown in FIG. 2 and is identified as a paint dispenser designated generally by the numeral 40. The dispenser 40 provides for a mounting head 42 which may be connected to the wrist 26 of the robot shown in FIG. 1. Opposite the mounting head 42 is a dispensing head 44, which may be referred to as an atomizer. The dispenser 40 provides a center of gravity 46, which provides a reference point as the dispenser 40 moves about the trajectory and performs its specific functions. The positional relationship between the center of gravity 46 relative to the robot mounting plate or platform 14 and/or the wrist 26 is needed to provide for a reference as to the implement's position and any motions associated therewith.

Figure 3:
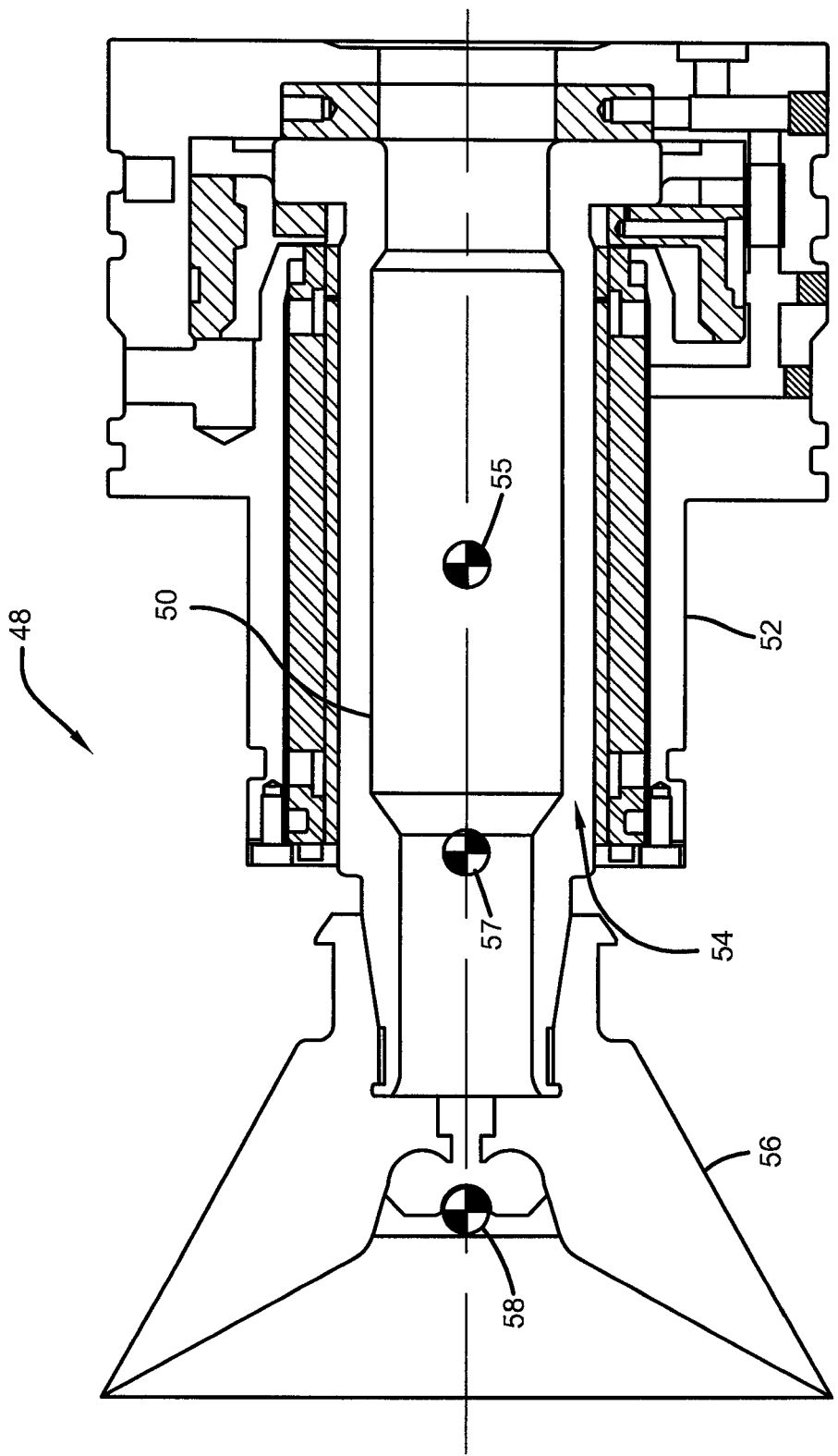
FIG. 3 is a detailed view of an air motor used with the paint dispensing implement according to the concepts of the present invention.

As seen in FIGS. 2 and 3, the dispensing head 44 carries an air motor 48, which includes a rotor 50 that spins within a stator 52. In order to maintain proper operational tolerances and proper dispensing of a fluid such as paint, an air cushion 54 is maintained between the rotor 50 and the stator 52. As previously discussed in the Background Art, the rotor spins at very high speeds (10,000 to 70,000 RPM), and any sudden change or reversal of the wrist's motion or other moving robot component may cause the rotor to overcome the air cushion 54 and related desired spacing from the stator and damage both parts. The air motor 48 provides for a center of gravity designated generally by the numeral 55 so as to provide a point of reference. A bell cup 56 is attached to the rotor 50. As is well known, paint or other fluid is injected into the rear of the bell cup and is atomized by being forced out to the edge of the cup by centrifugal forces. The rotor 50 provides a center of gravity 57 and the bell cup 56 provides a center of gravity 58. The center of gravity determinations and the inertia moments for the rotor, the air motor and the bell cup, as will be discussed, are used to model the operation of the paint dispenser implement for determining optimal operation of the implement and the robot.

Figure 4:
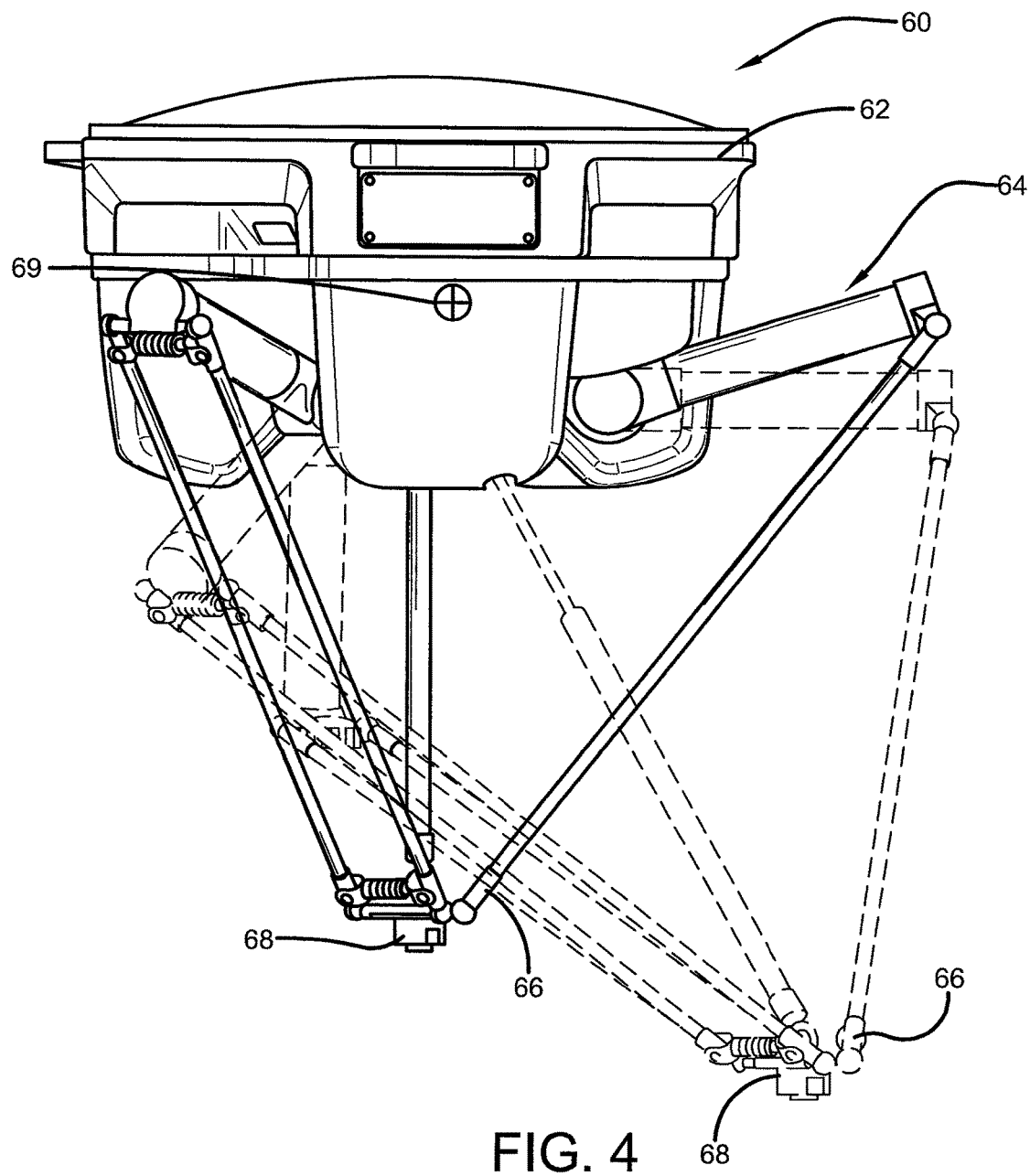
FIG. 4 is an elevational view of a gripping implement for use with the robot according to the concepts of the present invention.

Another type of implement is shown in FIG. 4, where a gripper is designated generally by the numeral 60. The gripper 60 includes a mount head 62, which may be attached to the wrist 26 or other moveable component of the robot 12. Extending from the head 62 is at least one hinged arm 64. Skilled artisans will appreciate that a combination of hinged and unhinged arms may be employed. In any event, each arm 64 has an arm end 66 opposite the mount head 62. The arm end(s) 66 may attach to a work piece 68 for the purpose of picking up the piece and/or placing the piece in a desired position with respect to some other component. The gripper 60, much like the paint dispenser 40, may undergo significant changes in velocity, acceleration and/or angular motions during movement by the robot and in particular, during movement of the wrist. When using the gripper 60, it will be appreciated that holding forces must be maintained to hold the part, and these forces must be accounted for during any type of motion or force. The gripper 60 includes a center of gravity 69.

As with the dispenser 40 and all other implements and their moving components that may be used with a robot, a center of gravity of the implement and a center of gravity of moving components carried by the implement provide a frame of reference to the robot and/or components of the robot so as to allow determination of linear or angular position, velocity, acceleration, inertia moment, or torque values in their respective planes or directions of motion. These dynamic motion values may be used to model the operation of the implement and/or the robot.

Figure 5:
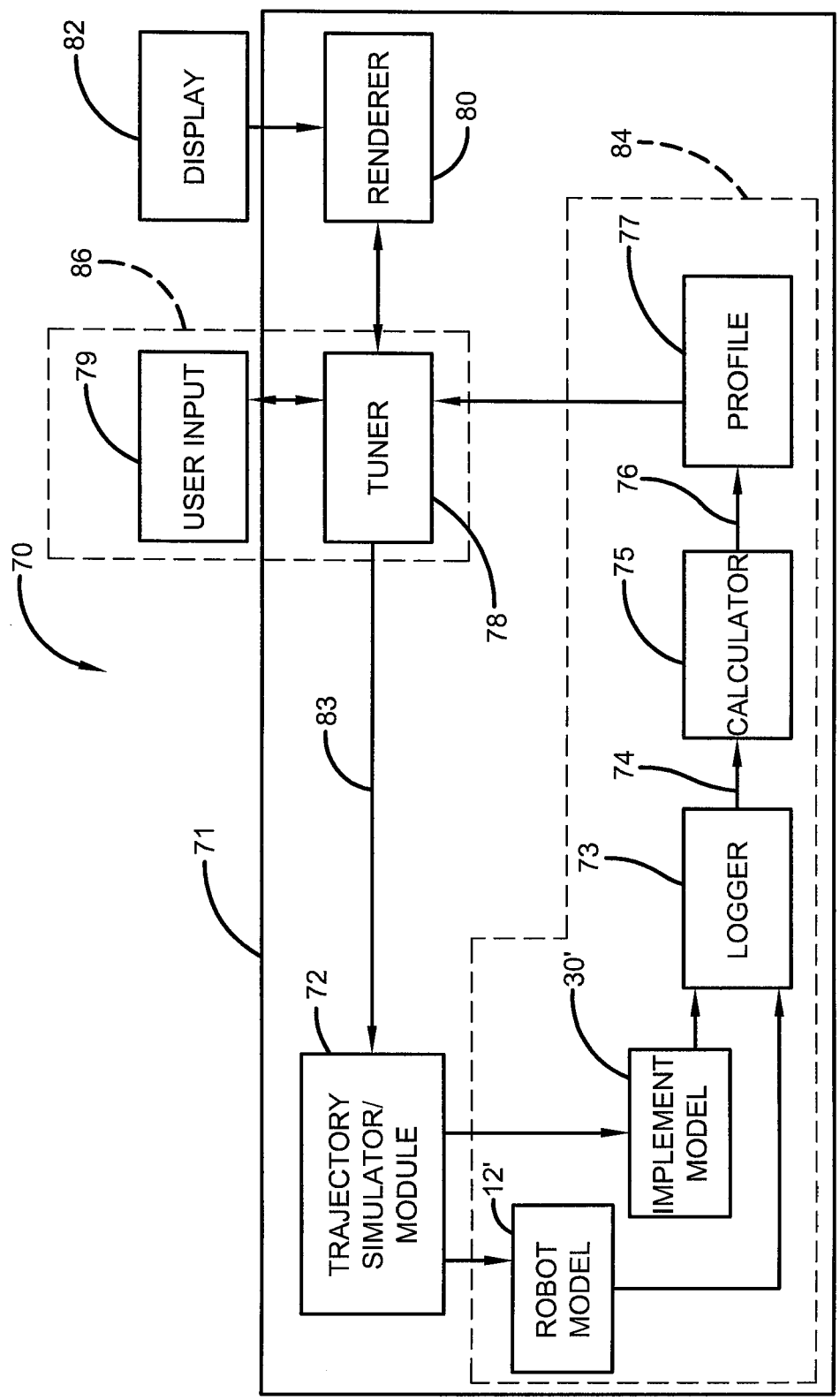
FIG. 5 is a schematic diagram of a dynamic motion determination system according to the concepts of the present invention.

Referring now to FIG. 5, it can be seen that a dynamic motion determination system is designated generally by the numeral 70. The system 70 includes a controller 71 that provides the necessary hardware, software, and associated algorithms to run simulations of robot motion and motion of the associated implements as will be described. Incorporated into the system 70 is a trajectory simulator/module 72. When using the simulator/module 72 technicians determine a suitable path for the robot function and motion of the associated implement so as to complete a desired function such as painting, assembly of placement parts, movement of a welding assembly or the like. Indeed, any implement that is associated with a robot may be incorporated into the trajectory simulator/module.

The simulator/module 72 provides simulated travel or pathway instructions to a robot model 12' such that all the motions of the moveable components of the robot are coordinated with one another so that there are no lapses or interferences in motion. Also receiving input from the trajectory simulator/module is an implement model 30'. The implement model 30' provides calculated dynamic motion data such as linear and angular motions. These include, but are not limited to positions, velocities, accelerations, torque and/or force and generally include all the motions of the implement required to perform the desired task. Both the robot model 12' and the implement model 30' represent known motion characteristics and capabilities of the robot 12 and the implement 30 and the models may include motion data for sub-components of the implement and/or the robot. The models are developed based on characteristics of the implements that they represent and operation of their respective motors, hydraulics and other components. In some instances, the models may be based on data collected from one or more sensors associated with the robot and/or implement and/or their moving components. These sensors collect data which can then be incorporated into various algorithms to verify or establish the models used in the system 70. Skilled artisans will appreciate that data for the model 12' and the model 30' may be maintained in appropriate databases that are accessible by any component of the system 70.

In one embodiment it is important to consider the gyroscopic effect such as provided by a paint dispensing implement 40. Sometimes referred to as is torque-induced precession, gyroscopic precession is the phenomenon in which the axis of a spinning object defines a cone in space when an external torque is applied to it. As will be appreciated by skilled artisans, torque is the rate of change of the angular momentum. Precession is the result of the angular velocity of rotation and the angular velocity produced by the torque. Moreover, precession is an angular velocity about a line that makes an angle with the permanent rotation axis, and this angle lies in a plane at right angles to the plane of the couple producing the torque. In developing an implement model, it is important to consider these characteristics, and this is done by utilizing three-dimensional rigid body dynamic techniques such as provided by Euler's equations. These equations emulate the rotation of a three-dimensional rigid body utilizing a rotating reference frame with its axes fixed to the body and parallel to the body's principal axes of inertia. Utilizing these equations results in values for torque, the moments of inertia, and angular velocities. The equations general form is:

$$I \cdot \dot{\omega} + \omega \times (I \cdot \omega) = M.$$

where M is the applied torques, I is the inertia matrix, and w is the angular velocity about the principal axes.

In 3D principal orthogonal coordinates, they become:

$$I_1 \dot{\omega}_1 + (I_3 - I_2)\omega_2 \omega_3 = M_1$$

$$I_2 \dot{\omega}_2 + (I_1 - I_2)\omega_3 \omega_1 = M_2$$

$$I_3 \dot{\omega}_3 + (I_2 - I_1)\omega_1 \omega_2 = M_3$$

where M represents the components of the applied torques, I represents the principal movements of inertia, and ω represents the components of the angular velocity about the principal axes. The governing equations are those of conservation of linear momentum $L=MvG$ and angular momentum $H=[I]\omega$.

In order to properly describe the dynamic motion of both the robot model and the implement model, linear motion and rotational motion must be accurately modeled. In regard to the linear motion; position, linear velocity, linear acceleration and force calculations may be required. In regard to rotational motion; angles, angular velocity, angular acceleration and torque values may be required. These values are defined by data input which represent the joint (robot interconnection points) values from each robot at a specified time stamp wherein the time stamp may range anywhere from about four milliseconds to 100 milliseconds. Also considered in these calculations are the center of gravity of the implement and the center of gravity of other moving components of the implement relative to a robot mounting plate. These modeling algorithms output a position and orientation matrix of the center of gravity of the implement and associated assembly.

As noted, position data of the robot 12 may be taken from selected robot joints at incremental time stamps. The center of gravity values for the implement and components of the implement relative to a mounting plate, such as an end of the forearm 24, may be utilized to determine forward kinematics. This data can then be used to develop a position and orientation matrix at the center of gravity of the implement and its components.

Linear velocity can be determined when given positions at three consecutive time stamps: p1, p2 and p3

$$v_1 = (p_2 - p_1)/dt$$

$$v_2 = (p_3 - p_2)/dt$$

Linear acceleration can then be determined given velocities at two consecutive time stamps: v1, v2

$$a_1 = (v_2 - v_1)/dt$$

And force can be determined from $f_1 = m \cdot a_1$.

In determining angular values, the XYZ convention for Euler angles may be employed. First rotation is about the fixed axis: precession, psi, from XYZ to x'y'z' for the moving reference frame. Second rotation is about the y' axis: nutation, theta, from x'y'z' to x"y"z". Last rotation is about the z" axis: spin, phi, from x"y"z" to xyz.

$$R_\phi = \begin{pmatrix} \cos\phi & \sin\phi & 0 \\ -\sin\phi & \cos\phi & 0 \\ 0 & 0 & 1 \end{pmatrix}$$

$$R_\theta = \begin{pmatrix} \cos\theta & 0 & -\sin\theta \\ 0 & 1 & 0 \\ \sin\theta & 0 & \cos\theta \end{pmatrix}$$

$$R_\psi = \begin{pmatrix} \cos\psi & \sin\psi & 0 \\ -\sin\psi & \cos\psi & 0 \\ 0 & 0 & 1 \end{pmatrix}$$

$$R_\phi \times R_\theta \times R_\psi =$$

$$\begin{pmatrix} \cos\phi\cos\theta\cos\psi - \sin\phi\sin\psi & \cos\phi\cos\theta\sin\psi + \sin\phi\cos\psi & -\cos\phi\sin\theta \\ -\sin\phi\cos\theta\cos\psi - \cos\phi\sin\psi & -\sin\phi\cos\theta\sin\psi + \cos\phi\cos\psi & -\sin\phi\sin\theta \\ \sin\theta\cos\psi & \sin\theta\sin\psi & \cos\theta \end{pmatrix}$$

$$\theta = \cos^{-1}(a_{33})$$

$$\phi = \tan^{-1}(a_{23}/(-\sin\theta), a_{13}/(-\sin\theta))$$

$$\psi = \tan^{-1}(a_{32}/\sin\theta, a_{31}/\sin\theta)$$

In determining the angular velocity and acceleration values derived therefrom, given position and orientation matrix at two consecutive time stamps: M1, M2. The transformation matrix between them is $W = M_1^{-1} M_2$. The transformation matrix W is a skew symmetric matrix which is defined as:

$$W(t) = \begin{pmatrix} 0 & -\omega_z(t) & \omega_y(t) \\ \omega_z(t) & 0 & -\omega_x(t) \\ -\omega_y(t) & \omega_x(t) & 0 \end{pmatrix}$$

From this the angular velocities can be calculated as $$\omega_x = (W_{32} - W_{23}) * 0.5/dt$$

$$\omega_y = (W_{13} - W_{31}) * 0.5/dt$$

$$\omega_z = (W_{21} - W_{12}) * 0.5/dt \quad \omega_z' = \omega_z + \omega_{z\text{-spinning}}$$

And given two consecutive angular velocities $\omega_1$ and $\omega_2$, the angular acceleration is calculated as $\alpha_1 = (\omega_2 - \omega_1)/dt$.

These values can then be used to determine moment, which may also be called torque, moment of external forces, or moment of force. As such, a moment of inertia, $I_2$ $I_2$ $I_3$ of the rotor assembly, the moment can be calculated as:

$$M_1 = I_1\alpha_1 + (I_3 - I_2)\omega_2\omega_3$$

$$M_2 = I_2\alpha_2 + (I_1 - I_3)\omega_3\omega_1$$

$$M_3 = I_3\alpha_3 + (I_2 - I_1)\omega_1\omega_2$$

The above equations are utilized in the system 70 with the other input variables so as to develop the robot model 12' and the implement model 30' which are then used to simulate an optimal trajectory path of the implement which includes operation parameters of the implement.

Both the robot model 12' and the implement model 30' may be input into a logger 73 which receives the models and also the related trajectory information and associates a time stamp for any number of variables or values associated with the movement of the robot and the implement. In other words, the logger determines for each increment of time an associated linear and rotational value for the implement and/or the robot and their respective components. As a result, positional, speed, acceleration and force values (linear and rotational) of the implement and/or robot component relative to the base can be obtained. The logger 73 generates logger data 74, which represents the aforementioned values, which is in turn received by a calculator 75. The calculator 75 calculates the linear motion values such as position, velocity, acceleration, and force while also calculating rotational values such as angles, angular velocity, angular acceleration and torque at the time stamps. The calculator then generates calculation data 76, which is received by a profile 77. The profile 77 may be in any number of forms that can be used for analysis. In one embodiment, the profile may transfer the results to a tuner 78, which further presents the results through a renderer 80 and a display 82. The results may be presented as raw data, graphs or any other meaningful representation. User input 79 observes the data provided in the display or elsewhere and notes where excessive values are detected and may adjust the trajectory path to provide for more time in certain areas or make other adjustments so that the accelerations, either linear or angular, are not so extreme. By reducing such occurrences less damage may be imparted to the implement and the implement's components. As such, the trajectory of the robot and/or implement may be optimized for cycle time, but without damaging any of the associated equipment. These user adjustments are then transferred by the tuner in the form of adjustment data 83 to the trajectory simulator 72 so that another simulation may be run to confirm that the revised trajectory path and/or the implement motion are optimized.

In summary, the system 70 determines an optimal trajectory path for a robot with the attached implement. At its most basic level, the system 70 provides for a trajectory module 72, a data module 84 and a tuning module 86. As noted previously, the trajectory module 72 provides a defined simulated motion of a simulated robot and a defined motion of a simulated implement that is associated with the robot. In other words, the trajectory module, based upon input from a user or an automated system for generating a trajectory, which defines a step-by-step motion for the simulated movable components of a robot in conjunction with the simulated movable components of the implement. As such, a coordinated trajectory, which is believed to be the most efficient way for moving an implement about a workpiece, such as utilized in painting applications, is defined. Skilled artisans will appreciate that such a module may also be used with other robots and associated implements.

Once the simulated motion of both the robot and implement are defined, these defined motions are presented to a data module 84. The data module 84 includes at least the robot model 12', the implement model 30', the logger 73, the calculator 75 and the profile 77. The data module generates step-by-step motion data of the simulated robot and the simulated implement model to determine how the implement and robot arm will perform under the trajectory motion defined by the trajectory module. In other words, the data module 84 generates data for each step or time stamp for the robot and implement models for analysis. This provides a determination as to how the components of the implement and the components of the robot will perform. As such, various linear and rotational velocities, acceleration and moment arms can be obtained based on the calculated values.

This collected data is provided to a tuning module 86 which, based upon the data collected and predetermined thresholds, can determine where excessive rotational speeds or linear speeds of the components may result in damage to an actual implement or robot in real use. The tuning module 86 can receive input from a user which detects areas of concern or an automated system may be provided which automatically detects areas of concern based on various combinations of when the predetermined thresholds for the various variables are exceeding their respective thresholds and adjusts motion of the robot arm and/or implement accordingly. In one embodiment, the tuning module may utilize a pre-determined combination of thresholds, which when exceeded within a pre-determined range of time stamps, adjusts the simulated motion of the implement and/or the robot. The tuning module then provides this information to the trajectory module for re-analysis.

Figure 6:
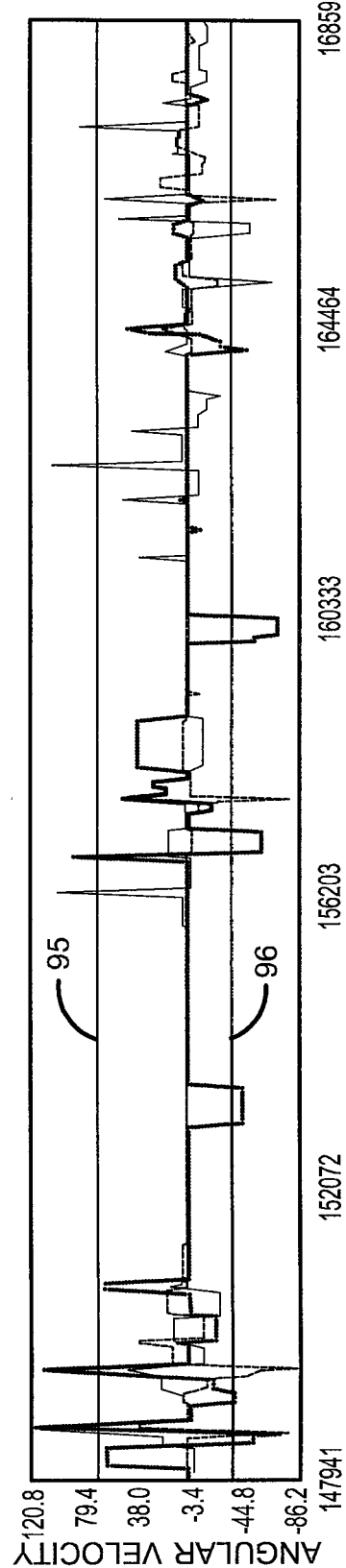
FIG. 6 is a graphical representation of a paint dispensing implement's angular velocity according to the concepts of the present invention.

Referring now to FIG. 6, it can be seen that an exemplary plot showing the angular velocity (vertical axis) in the X, Y, and Z planes vs. time stamp (horizontal axis) for the implement 40 is presented. From this plot it can be seen when excessive angular velocities occur. Based upon knowledge of the user regarding operation of the implement, predetermined upper and lower thresholds 95 and 96, respectively, can be set. As a result, any time an angular velocity or other modeled characteristic exceeds a predetermined threshold, the user may determine that the trajectory path is problematic and make adjustments with the tuner 78 which, in turn, adjusts the simulation maintained by the trajectory simulator/module. User input 79 may also include programmable features that register the occurrences (when the thresholds are exceeded) and then automatically adjust operation of the implement and/or robot models to permit re-running of the simulation. The adjustments may be made based on the number of occurrences within a predetermined time period, the number of occurrences in a particular axis of rotation, or any combination of pre-determined occurrences. Skilled artisans will also appreciate that the adjustments may consider the need to operate the implement and/or robot within a predetermined cycle time.

Figure 7:
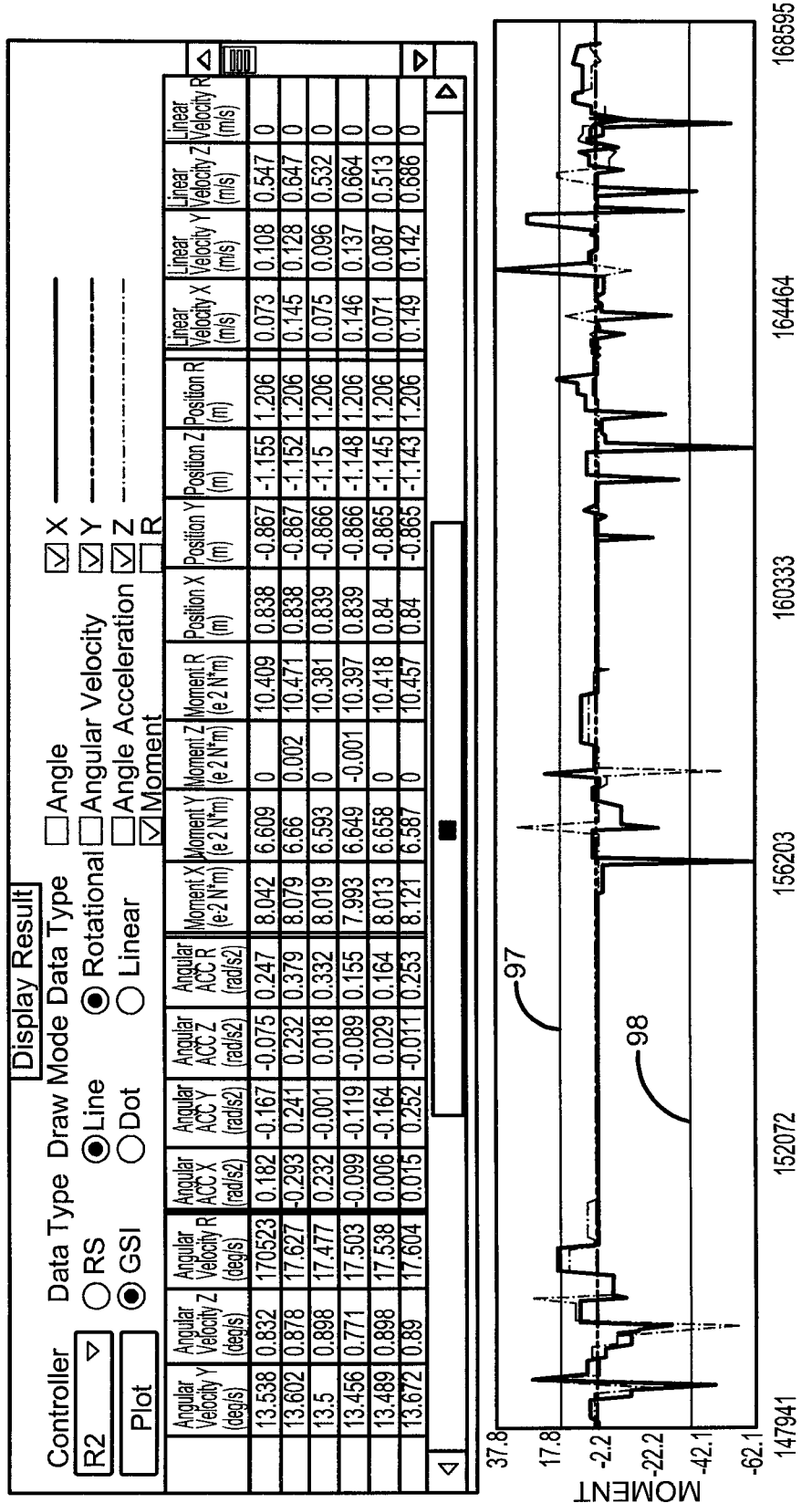
FIG. 7 is a graphical representation of the paint dispensing implement's rotor moment according to the concepts of the present invention.

FIG. 7 shows a plot for the implement 40, which sets out the moment (vertical axis) in the X, Y, and Z planes for the implement vs. time stamp (horizontal axis). Predetermined upper and lower thresholds, 97 and 98 respectively, may be established so as to determine when moment values are exceeded. Upon seeing where the thresholds are exceeded the user may adjust the turner 84 to avoid problematic areas of the trajectory. Indeed, as noted in the discussion related to FIG. 6, user input 88 may allow for automatic adjustments based on the type and/or frequency of an occurrence or any pre-selected combination of occurrences.

Figure 8:
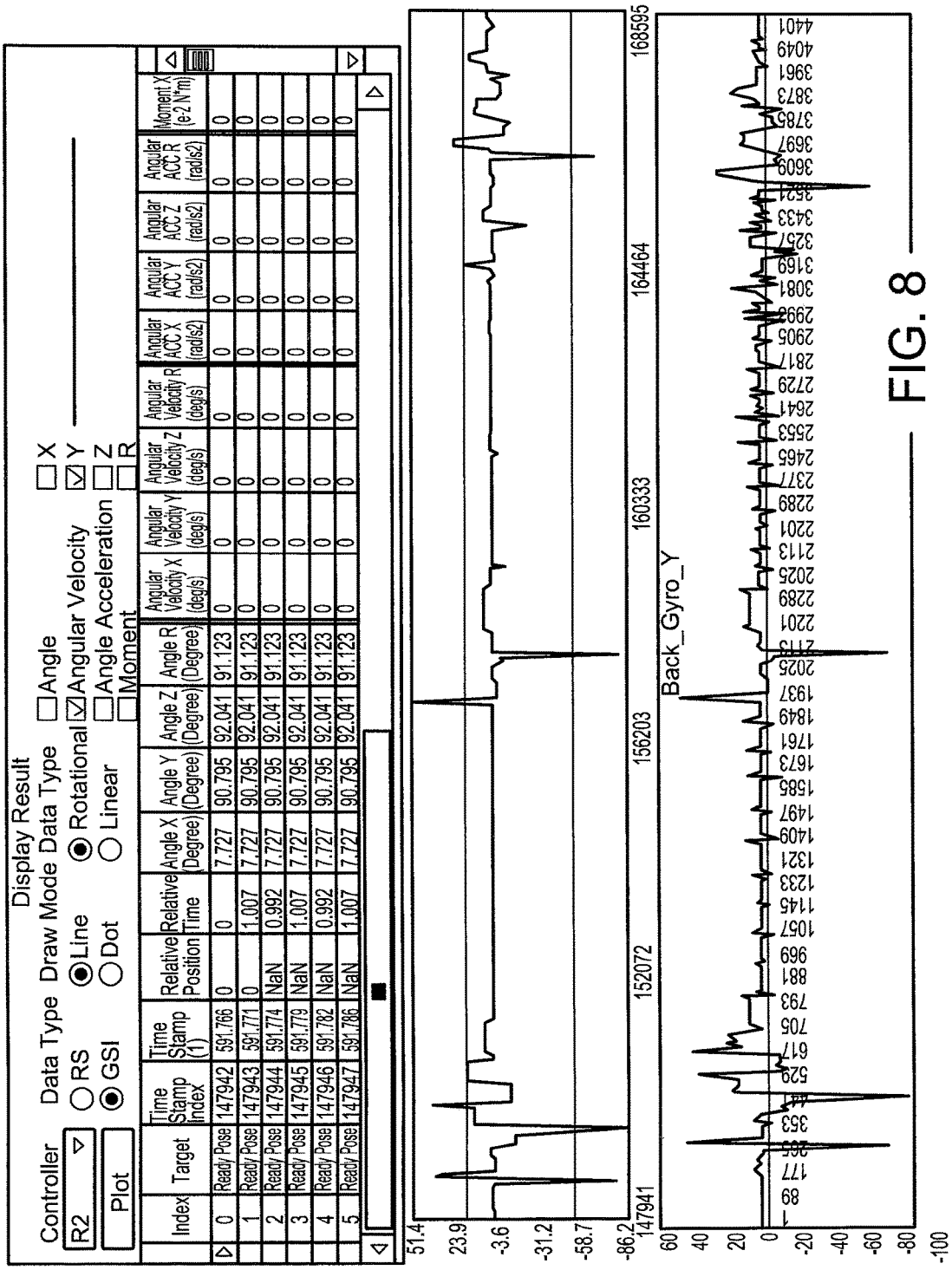
FIG. 8 is a graphical representation of validation of a paint dispensing implement's angular velocity which compares calculated data against measured data according to the concepts of the present invention.

Referring now to FIG. 8, in order to ensure that the data calculated by the controller and associated components of the simulator are valid, a sensor 99 (as shown in FIG. 2) may be attached to an actual implement 40, such as the paint dispenser, to monitor various linear and angular motions to determine actual linear and angular velocity, acceleration values, moment and force values, and so on. As can be seen by the calculated values on the top plot of FIG. 8, those match fairly well with the actual values detected by the sensor 99 shown in the lower plot. As such, it is believed that the simulation provides for accurate representations of the linear and rotational motions of the implement. Validations for any specific component of the implement or robot by using an appropriately attached sensor may be utilized to ensure the accuracy of the simulation.

Figure 9:
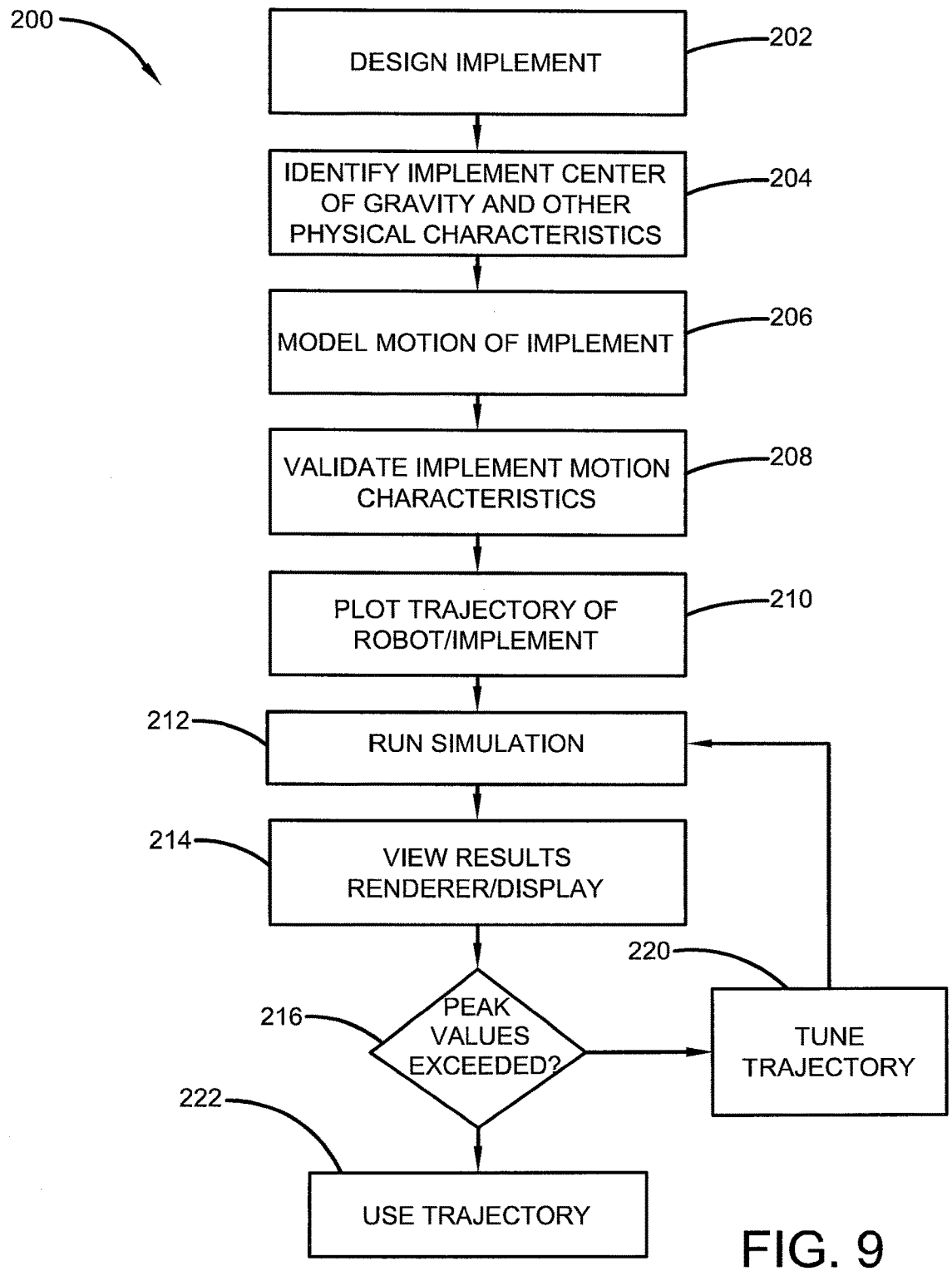
FIG. 9 is a flow chart for determining dynamic motion data for an implement and robot trajectory.

Referring now to FIG. 9, a methodology for optimizing robot implement performance is designated generally by the numeral 200. At step 202, an implement and related its operational features are designed. Next, at step 204, a center of gravity for the implement and a center of gravity for moveable components within the implement, if provided, are identified. At step 206 mathematical models, as described above or as appropriate, are configured for the implement and its moveable components so as to estimate how the implement model will perform when simulated trajectory paths and operations are utilized. Next, at step 208, the implement motion characteristics are evaluated and validated as embodied in the plot shown in FIG. 8. In other words, an appropriate sensor is applied to an actual implement, and values are observed as the implement is guided through various trajectory paths and motions. Once these characteristics are validated, then at step 210, a trajectory plot of a model robot and a model implement is provided at step 210. Next, at step 212, the system 70 runs a simulation to determine how the implement and associated robot will perform in a designated task.

These results are then viewed at step 214 at the display or other representation of the motion data. At step 216, a determination may be made by a user or by an automated process maintained within the system to determine whether predetermined peak or threshold values are exceeded or not. If the values are exceeded, then at step 220, the trajectory is tuned and the simulation is run again at steps 212 and 214. Once the number of peak values is minimized to a desired level, then the trajectory 222 may be used in an actual robotic operation.

The advantages of the present invention are readily apparent. By utilizing the dynamic data motion of the implement and the robot, trajectories can be adjusted in order to prevent damage to the implement and/or the robot that may otherwise be caused by operating beyond the dynamic limitations. This saves on tooling costs and prevents operational down time for damaged implements.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. A simulation system to determine an optimal trajectory path for a robot with an attached implement, comprising:
a trajectory simulator providing a simulated trajectory path for movable components of said robot in conjunction with movable components of said attached implement;
an implement model database comprising motion data of said movable components of said attached implement and a robot model database comprising motion data of said movable components of said robot;
a logger that associates a time stamp of said robot's motion and said attached implement's motion during motion of said robot and said attached implement along said simulated trajectory path to generate logger data;
a profile determined by said logger data received from said logger which identifies motion of said movable components of said robot and motion of said attached implement that exceeds predetermined thresholds; and
a tuner to adjust said simulated trajectory path so as to reduce the number of times predetermined thresholds are exceeded.

2. The system according to claim 1, wherein said tuner is adapted to receive user input to set said predetermined thresholds.

3. The system according to claim 2, wherein said implement model database includes data selected from the group consisting of linear velocities, angular velocities, angular accelerations, and moment values.

4. The system according to claim 2, further comprising:
a calculator to receive said logger data and calculate selected forces at each said time stamp for comparison to said predetermined thresholds.

5. The system according to claim 1, wherein said implement model database includes data selected from the group consisting of linear velocities, angular velocities, angular accelerations, and moment values.

6. The system according to claim 1, wherein said implement model database represents a paint dispenser.

7. The system according to claim 6, wherein said paint dispenser comprises:
a dispensing head;
a stator carried by said dispensing head;
a rotor rotatably received within said stator, wherein an air cushion is maintained between said stator and said rotor.

8. The system according to claim 7, wherein said implement model database includes data values of said stator, said rotor and said dispensing head based on center of gravity values for said dispensing head, said stator and said rotor.

9. A simulation system to determine an optimal trajectory path for a robot with an attached implement, comprising:
a trajectory module that defines simulated motion for movable components of said robot in conjunction with movable components of said attached implement;
a data module that generates motion data of said movable components of said robot and of said attached implement as said robot and said attached implement are guided along a trajectory defined by said simulated motion; and
a tuning module that adjusts said simulated motion based on said motion data of said movable components of said robot and of said attached implement that exceeds predetermined thresholds.

10. The simulation system according to claim 9, wherein said trajectory module receives user or automated input to define a step-by-step motion for said simulated robot and said simulated implement.

11. The simulation system according to claim 10, wherein said data module associates each time-stamp in the step-by-step motion with corresponding data values.

12. The simulation system according to claim 11, wherein said tuning module requires a pre-determined combination of thresholds within a predetermined range of time stamps to adjust said simulated motion.

13. A method for optimizing robot implement performance comprising:
 generating a model of robot motion and implement motion for movable components of a robot and for movable components of an implement attached to said robot;
 plotting a trajectory for said movable components of said robot and of said attached implement;
 running a simulation of said trajectory by moving the robot and the attached implement along the trajectory to determine motion of the movable components of the robot and of the movable components of the attached implement that exceeds predetermined thresholds; and
 tuning said trajectory to reduce the number of times robot motion and implement motion exceeds predetermined thresholds.

14. The method according to claim 13, further comprising:
 validating said model of implement motion.

15. The method according to claim 14, further comprising:
 displaying results of said simulation to visualize when said implement motion exceeds predetermined thresholds.

16. The method according to claim 15, further comprising:
 running said simulation of said trajectory after tuning to determine effectiveness of tuning said trajectory.

17. The method according to claim 13, further comprising:
 selecting a characteristic of implement motion to monitor during said simulation.

18. The method according to claim 17, wherein said characteristic is linear or rotational.

19. The method according to claim 18, wherein said linear characteristic is selected from the group consisting of position, linear velocity, linear acceleration and force.

20. The method according to claim 18, wherein said rotational characteristic is selected from the group consisting of angles, angular velocity, angular acceleration and torque.

21. The method according to claim 17, wherein said characteristic is associated with said implement's center of gravity.

* * * * *